United States Patent
Chen et al.

(10) Patent No.: US 8,642,445 B2
(45) Date of Patent: Feb. 4, 2014

(54) METHOD AND APPARATUS FOR REDUCING PACKAGE WARPAGE

(75) Inventors: Meng-Tse Chen, Changzhi Township (TW); Hui-Min Huang, Taoyuan (TW); Chun-Cheng Lin, New Taipei (TW); Chih-Chun Chiu, Zhudong Township (TW); Ming-Da Cheng, Jhubei (TW); Chung-Shi Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/476,340

(22) Filed: May 21, 2012

(65) Prior Publication Data

US 2013/0260535 A1  Oct. 3, 2013

Related U.S. Application Data

(60) Provisional application No. 61/617,587, filed on Mar. 29, 2012.

(51) Int. Cl.
*H01L 21/301* (2006.01)

(52) U.S. Cl.
USPC ........... 438/460; 438/106; 438/464; 438/492; 438/507; 438/691; 257/E21.499

(58) Field of Classification Search
None
See application file for complete search history.

(56) References Cited

U.S. PATENT DOCUMENTS 5,492,866 A * 2/1996 Nishikawa .................. 29/827
2007/0273018 A1* 11/2007 Onozuka et al. ............ 257/690

* cited by examiner

*Primary Examiner* — Kyoung Lee
(74) *Attorney, Agent, or Firm* — Lowe Hauptman & Ham, LLP

(57) ABSTRACT

Embodiments of mechanisms for flattening a packaged structure are provided. The mechanisms involve a flattening apparatus and the utilization of protection layer(s) between the packaged structure and the surface(s) of the flattening apparatus. The protection layer(s) is made of a soft and non-sticking material to allow protecting exposed fragile elements of the packaged structure and easy separation after processing. The embodiments of flattening process involve flattening the warped packaged structure by pressure under elevated processing temperature. Processing under elevated temperature allows the package structure to be flattened within a reasonable processing time.

20 Claims, 5 Drawing Sheets

METHOD AND APPARATUS FOR REDUCING PACKAGE WARPAGE

CROSS-REFERENCE TO RELATED APPLICATIONS

The present application claims priority of U.S. Provisional Patent Application Ser. No. 61/617,587, filed on Mar. 29, 2012, which is incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less areas or heights than packages of the past, in some applications.

Thus, new packaging technologies, such as wafer level packaging (WLP) and package on package (PoP), have begun to be developed. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1A:
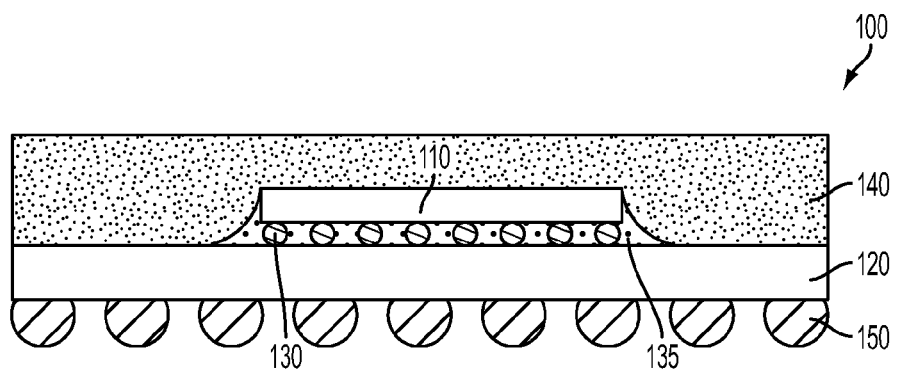
FIG. 1A is a cross sectional view of a semiconductor package, in accordance with some embodiments.

FIG. 1A is a cross sectional view of a semiconductor package 100, in accordance with some embodiments. Semiconductor package 100 includes a semiconductor die 110, which is bonded to a substrate 120 by connectors 130. In some embodiments, there is an underfill 135 occupying the space between semiconductor die 110 and substrate 120. Underfill 135 helps reduce cracking of connectors 130 and delamination at dielectric interface(s) near the connectors. There could be connectors 150 under substrate 130. The semiconductor die 110 is covered with a molding compound 140.

The semiconductor die 110 includes a semiconductor substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOT) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 120 may be made of a semiconductor wafer, or a portion of wafer. In some embodiments, substrate 130 includes silicon, gallium arsenide, silicon on insulator ("SOT") or other similar materials. In some embodiments, substrate 120 also includes passive devices such as resistors, capacitors, inductors and the like, or active devices such as transistors. In some embodiments, substrate 120 includes additional integrated circuits. Substrates 120 may further include through substrate vias (TSVs) and may be an interposer. In addition, the substrate 120 may be made of other materials. For example, in some embodiments, substrate 120 is a multiple-layer circuit board. In some embodiments, substrate 120 also includes bismaleimide triazine (BT) resin, epoxy mixed with glass fibers, ceramic, glass, plastic, tape, film, or other supporting materials that may carry the conductive pads or lands needed to receive conductive terminals. Examples of epoxy mixed with glass fibers include FR-4 and FR-5, each of which is made of woven fiberglass cloths with an epoxy resin binder that is flame resistant.

Semiconductor die 110 is bonded to substrate 120 by connectors 130, which may include solder bumps, copper posts, or other applicable conductive structures bonded to a conductive layer or conductive structures on substrate 120. Connectors 150 may be made of solder bumps or solder balls. However, other applicable and conductive structures may also be used.

Substrate 120 is relatively large in comparison to semiconductor die 110. Substrate 120 could have a number of semiconductor dies similar to die 110 bonded thereto to form a number of semiconductor packages 100. The semiconductor packages 100 are later singulated, e.g., sawed, to separate packages 100 from each other to form individual packages 100.

During the manufacturing process of packaging semiconductor dies 110 on substrate 120, there are thermal processes involved. For example, the underfill 135 are cured after being dispensed to fill the space between semiconductor die 110 and substrate 120. In some embodiments, the underfill 135 is made of polymers, such as phenol, amine and anhydride resin which mixed with silica fillers, surfactant and coupling agent, etc. The curing helps the cross-linking of the polymers. In some embodiments, the curing temperature is in a range from about 100° C. to about 175° C. for a duration ranging from about 1 to about 4 hours. In addition, the molding process applies the molding compound 140 to cover semiconductor die 110 and the remaining space above substrate 120.

Alternatively, molding compound 140 may be applied on semiconductor die 110 and substrate 120, which does not have underfill 135. Molding compound 140 covers semiconductor die, substrate 120, and the space therebetween. Both methods (with and without underfill 135) involve post-curing to cross-link and/or thermo-set the polymers of molding compound material after it is dispensed on substrate 120. In some embodiments, the molding compound 140 is made of polymers, such as resin mixed with silica fillers, surfactant and coupling agent, etc. In some embodiments, the annealing temperature is in a range from about 100° C. to about 175° C. for a duration ranging from about 1 to about 4 hours.

The heating and cooling of the thermal processes could cause the package structure to warp due to mismatch of coefficients of thermal expansion (CTEs) of various materials on the package structure.

Figure 1B:
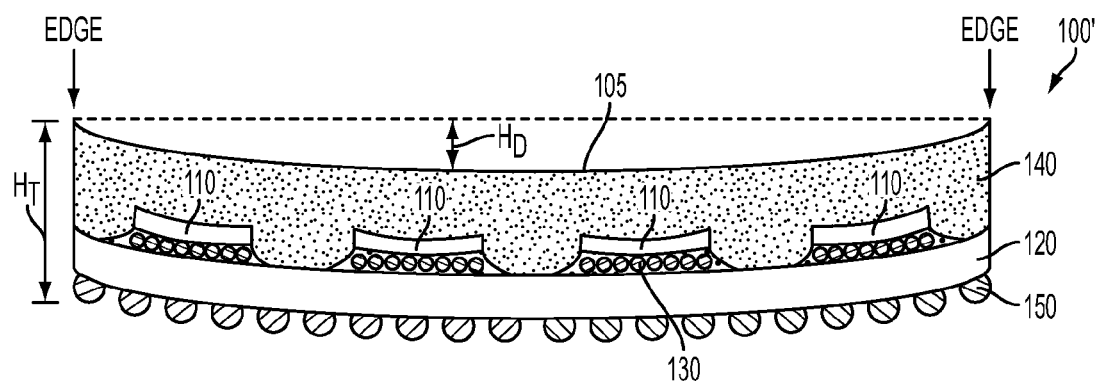
FIG. 1B is a cross-sectional view of a packaged structure with multiple semiconductor dies on a substrate, in accordance with some embodiments.

FIG. 1B is a cross-sectional view of a packaged structure 100' with multiple semiconductor dies 110 on substrate 120, in accordance with some embodiments. Due to the mismatch of CTEs of various materials on packaged structure 100', packaged structure 100' bows upward at the edges. Packaged structure 100' has a warpage issue, which affects subsequent processing and/or product reliability. In FIG. 1B, the maximum difference in height of surface 105 is $H_D$ and the total package height is $H_T$. The planarity of packaged structure 100' is defined in equation (1), as shown below.

$$\text{Planarity} = [1 - (H_D/H_T)] * 100\% \tag{1}$$

Low planarity (or severely warped) of packaged structure 100' causes stress to packaged dies and interferes with the sawing process. The warped packaged structure 100' is to be flattened before being sawed into individual packages to enable proper sawing and good package planarity.

Figure 2A:
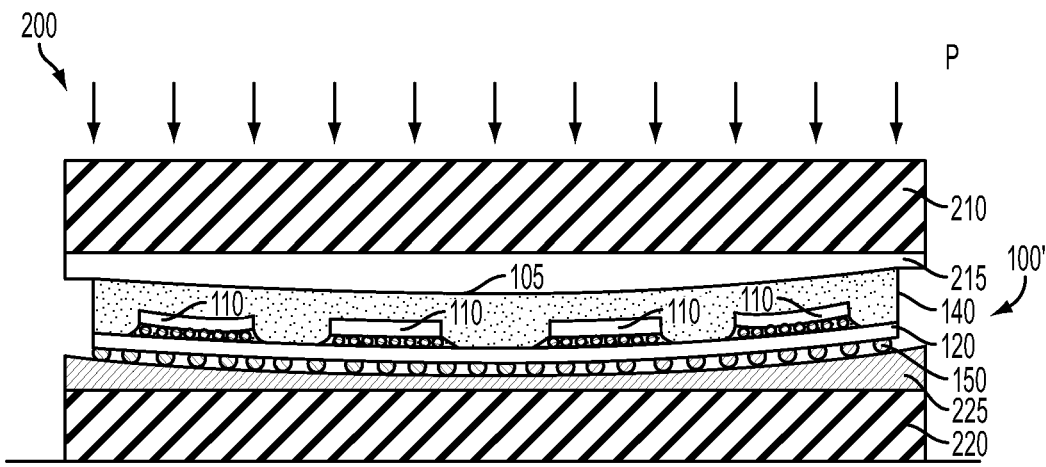
FIGS. 2A, 2B, 2D and 2E are cross-sectional views of the packaged structure of FIG. 1B in a sequential process for flattening the packaged structure of FIG. 1B, in accordance with some embodiments.

FIGS. 2A, 2B, 2D and 2E are cross-sectional views of the packaged structure 100' in a sequential process for flattening the packaged structure 100', in accordance with some embodiments. FIG. 2A is a cross-sectional view of the packaged structure 100' being placed in a flattening apparatus 200, in accordance with some embodiments. The apparatus 200 includes an upper flat plate 210 and a lower flat plate 220. The packaged structure 100' is sandwiched between an upper protection layer 215 and a lower protection layer 225. The upper protection layer 215 protects the upper surface 105 of packaged structure 100' from directly contacting the upper flat plate 210. Similarly, the lower protection layer 225 isolates connectors 150 on packaged structure 100' from lower flat plate 220. The packaged structure 100' sandwiched between the upper protection layer 215 and the lower protection layer 225 is placed on lower flat plate 220, the upper flat plate 210 is lowered and a pressure P is applied on the upper flat plate 210. The applied pressure P flattens the warped packaged structure 100'. In some embodiments, the pressure P applied is in a range from about 1 atm to about 50 atm.

The surface, such as a surface of the lower flat plate 220, of the flattening apparatus 200 that comes in contact with connectors 150 could also deform the connectors 150 when pressure P is applied without the protection of the lower protection layer 225. For example, connectors 150 could be made of solder balls, which could crack under pressure. Similarly, the surface, such as a surface of upper flat plate 210, of the flattening apparatus 200 that applies pressure P on packaged structure 100' could also damage the surface 105 of the package structure 100', if the surface 105 is not completely flat. The upper and lower protection layers 215, 225 are made of a soft material(s) that would yield under pressure to protect the surface 105 and connectors 150 from being deformed by pressure P applied to flatten the packaged structure 100'. In addition, the material(s) used to form the upper and lower protection layers 215, 225 should also be easily removable (or detachable) from the surfaces of packaged structure 100' protected by the upper and lower protection layers 215, 225. After the flattening process is completed, the packaged structure 100' is separated from the protection layers 215, 225. Protection layers 215, 225 made of material(s) easy to separate from protected objects would be beneficial. In some embodiments, the upper and lower protection layers 215, 225 are made of non-stick material, such as Polytetrafluoroethylene (PTFE), Ethylene tetrafluoroethylene (ETFE) or Teflon. PTFE, ETFT and Teflon are soft materials that would yield under pressure. In some embodiments, the tensile strength of the upper and/or protection layer is in a range from 10 to about 100 MPa.

The thickness of each of the protection layers 215, 225 is greater than about 50 μm, in some embodiments. In some embodiments, the thickness of each of the protection layers 215, 225 is in a range from about 0.05 mm to about 0.5 mm. In some embodiments, only the lower protection layer 225 next to connectors 150 is used and there is no upper protection layer 215 between the upper flat plate 210 and the surface 105 of the package structure 100'. Under such circumstances, connectors 150 are protected by lower protection layer 215, whereas the upper surface 105 of packaged structure 100' is considered flat and does not need protection by the upper protection layer 215. The term upper protection layer 215 or lower protection layer 225 is merely used to describe the embodiment shown in FIG. 2A. Packaged structure 100' may also be placed in the flattening apparatus 200 upside down, with connectors facing the upper flat plate 210. Under such circumstance, the protection layer used to protect connectors 150 may be referred to as an upper protection layer.

Figure 2B:
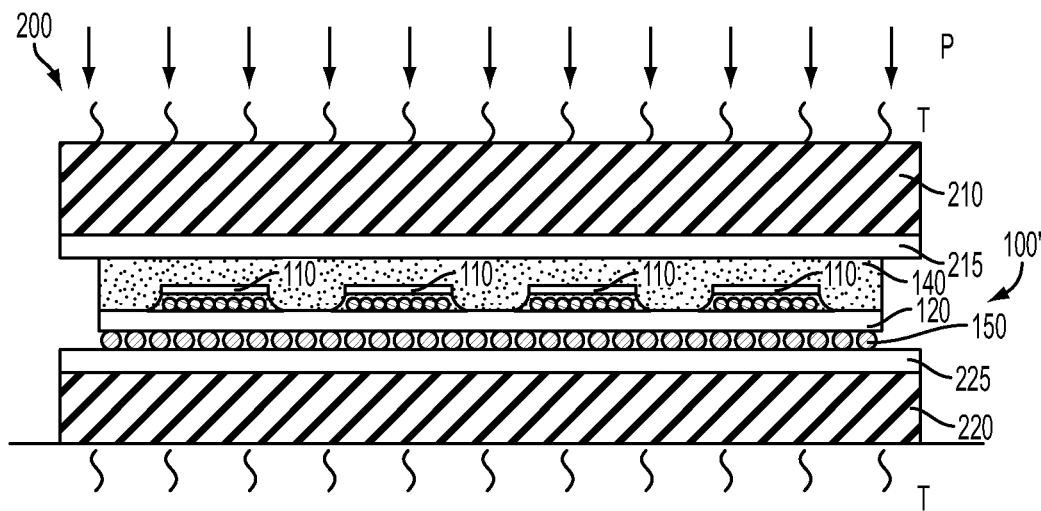
Figure 2C:
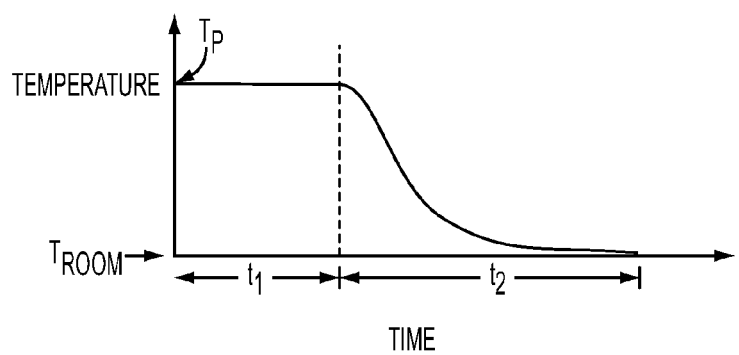
FIG. 2C is a thermal profile of the flattening process described in FIGS. 2A and 2B in accordance with some embodiments.

Applying the pressure P on the flattening apparatus 200 would temporarily flatten the packaged structure 100', unless the pressure is applied for an extended period. To ensure the warpage is reduced permanently within a reasonable time frame (for manufacturing cost concern), processing temperature can be raised to be greater than the glass transition temperature (Tg) of molding compound 140. In some embodiments, Tg ranges from about 110° C. to about 130° C. FIG. 2B is a cross-sectional view of the packaged structure 100' in a flattening process in which the pressure P and thermal treatment T are applied simultaneously, in some embodiments. The flattening process involves a thermal period I, during which the apparatus is operated at a processing temperature $T_P$, and a cooling period II, during which the apparatus 200 is cooled from $T_P$ to room temperature ($T_{room}$), as shown in FIG. 2C in accordance with some embodiments. In some embodiments, the processing temperature $T_P$ of the flattening process is in a range from about 140° C. to about 200° C. By cooling the packaged structure 100' to room temperature, the shape of the packaged structure 100' is set permanently flat.

Figure 2D:
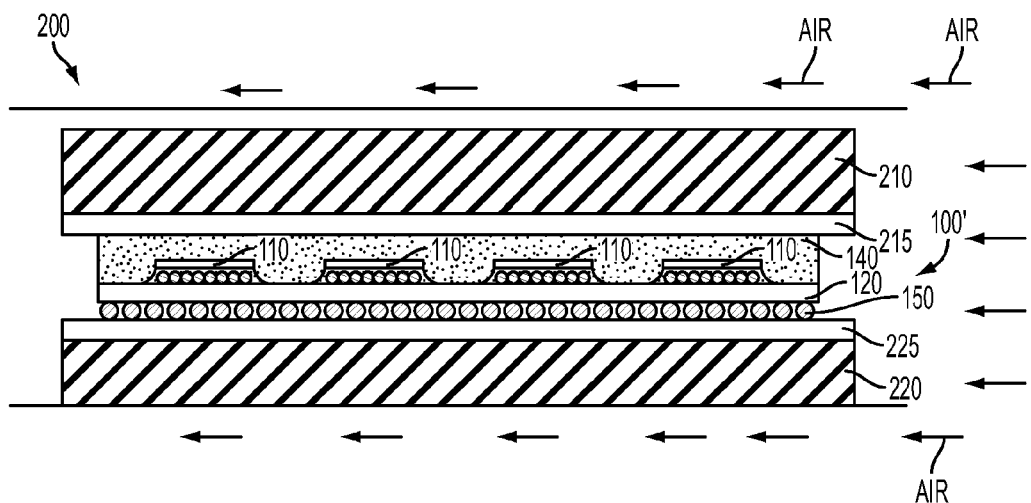

During both periods, the pressure P is applied on the apparatus 200. The cooling of the processing apparatus 200, with packaged structure 100' inside, can be accomplished by simply turning off the heating element and letting the heat dissipates in the environment. Alternatively, the cooling can be accomplished by blowing air (room temperature) or cooling gas over the apparatus 200, as shown in FIG. 2D in accordance with some embodiments. Alternatively, cooling coils (not shown) can be embedded in the upper flat plate 210 and/or the lower flat plate 220. Coolant can flow through the cooling coils to lower the temperature of flattening apparatus 200 and packaged structure 100'. During cooling, packaged structure 100' may be separated from apparatus 200, in accordance with some embodiments. The upper and lower protection layers 215, 225 may stay with or be separated from the packaged structure 100' during cooling.

In some embodiments, the processing time $t_1$ of the first period (thermal period) is in a range from about 15 minutes to about 2 hours. In some embodiments, $t_1$ is in a range from about 30 minute to about 1 hour. In some embodiments, the processing time $t_2$ of the second period (cooling period) is in a range from about 15 minutes to about 4 hours. In some embodiments, $t_2$ is in a range from about 30 minute to about 2 hours. In some embodiments, $t_2$ is in a range from about 30 minute to about 1 hour.

Figure 2E:
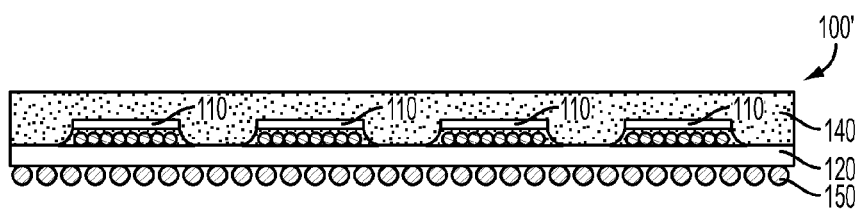

After the flattening process is completed, the packaged structure 100' is removed from apparatus 200 and separated from the protection layers 215 and 225. FIG. 2E is a cross-sectional view of a warpage-free packaged structure 100' after the flattening process, in accordance with some embodiments. The warpage-free packaged structure 100' can then be sawed (or diced) into individual semiconductor package 100.

Figure 3A:
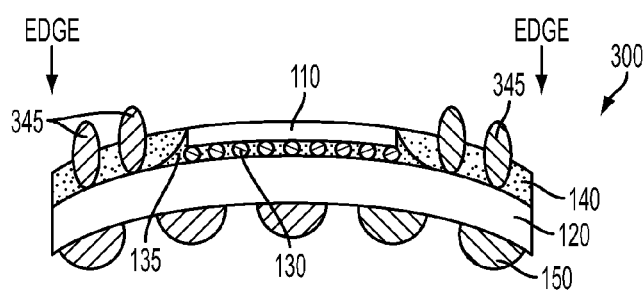
FIG. 3A is a cross sectional view of a semiconductor package, in accordance with some embodiments.

The semiconductor package 100 shown in FIG. 1A is merely an example. Other semiconductor packages may also suffer from warpage issue and is to be flattened during its manufacturing process. FIG. 3A is a cross-sectional view of a semiconductor package 300, in accordance with some embodiments. Semiconductor package 300 includes a semiconductor die 110, which is bonded to a substrate 120 by connectors 130. In some embodiments, there is an underfill 135 occupying the space between semiconductor die 110 and substrate 120. Underfill 135 helps reduce cracking of connectors 130 and delamination at dielectric interface(s) near the connectors. There could be connectors 150 under substrate 130. Substrate 130 is covered by a molding compound 140, which does not cover the semiconductor die 110, in contrast with semiconductor package 100 of FIG. 1A. As shown in FIG. 3A, a number of connectors 345 is connected to conductive components of substrate 120 and are embedded in the molding compound 140. Connectors 345 are formed to make electrical contact with conductive elements of another semiconductor package (not shown) that can be placed over semiconductor package 300 to become a package on package (PoP) structure. The molding compound 140 in FIG. 3A is thinner than the molding compound 140 of FIG. 1A. Due mismatch of CTEs in the semiconductor package 300, semiconductor package 300 is warped downward at the edges, as shown in FIG. 3A in accordance with some embodiments.

Figure 3B:
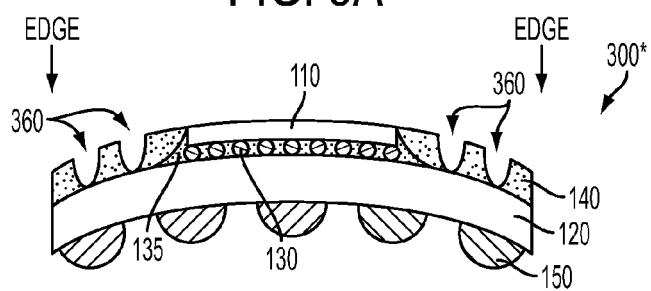
FIG. 3B is a cross sectional view another semiconductor package, in accordance with some embodiments.

FIG. 3B is a cross-sectional view of another semiconductor package 300* similar to semiconductor package 300, in accordance with some embodiments. Semiconductor package 300 is similar to semiconductor package 300* except that it does not have embedded connectors 345. Instead, semiconductor package 300* has a number of openings 360 that expose contacting pads (not shown) on the top surface of substrate 120. When another semiconductor package is place over semiconductor package 300* to form a PoP structure, conductive material from the other semiconductor package would fill opening 360 to make contact with the exposed contacting pads on substrate 120. Similarly, semiconductor package 300* also is warped downward at the edges, as shown in FIG. 3B in accordance with some embodiments. Although, semiconductor packages 300 and 300* in FIGS. 3A and 3B, respectively, are shown to warp downward at the package edges, the semiconductor packages 300 and 300* warp upward at the package edges in some embodiments.

Figure 3C:
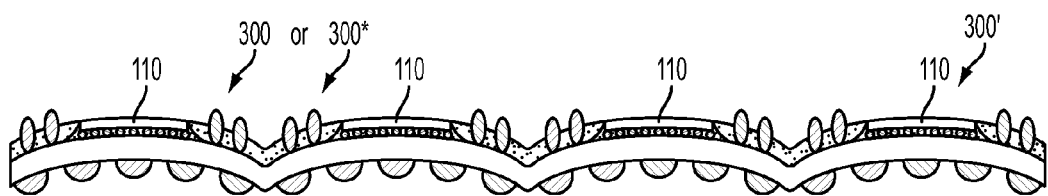
FIG. 3C is a cross-sectional view of a packaged structure with multiple semiconductor packages, in accordance with some embodiments.

FIG. 3C is a cross-sectional view of a packaged structure 300' with multiple semiconductor packages 300 or 300* before being sawed, in accordance with some embodiments. Due to the warpage of each semiconductor package 300 or 300*, package structure 300' exhibits wavy (or periodic) warpage along the structure 300'. Similarly, the warped packaged structure 300' is to be flattened before being sawed into individual packages. The process sequence and structures described in FIGS. 2A, 2B, 2D, and 2E and the thermal process described in FIG. 2C can also be applied to flatten the packaged structure 300', in some embodiments. However, due to the wavy (or periodic) warpage profile of packaged structure 300', other flattening mechanisms may also be used.

Figure 4:
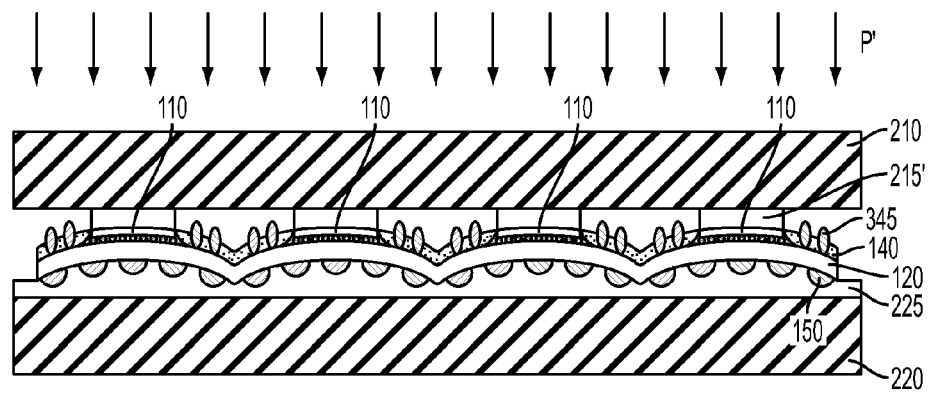
FIG. 4 is a cross sectional view of a packaged structure being placed in a flattening apparatus, in accordance with some embodiments.

FIG. 4 is a cross-sectional view of packaged structure 300' being placed in a flattening apparatus 200, in accordance with some embodiments. The apparatus 200 includes an upper flat plate 210 and a lower flat plate 220. FIG. 4 shows that there is a lower protection layer 225 protecting connectors on packaged structure 300' from lower flat plate 220. However, an upper protection layer 215' only covers the protruding portions of the package structure 300'. In some embodiments, the upper protection layer 215' covers the semiconductor dies 110. In some other embodiments, the upper protection layer 215' covers the semiconductor dies 110 and a portion of molding compound 140 surrounding each semiconductor die 110. As shown in FIG. 4, a portion of each packaged structure 100' is sandwiched between an upper protection layer 215' and a lower protection layer 225. The upper protection layer 215' protects the protruding portion on the upper surface 105 of each packaged structure 100' from directly contacting the upper flat plate 210. The lower protection layer 225 is a continuous layer, which isolates connectors 150 on packaged structure 100' from lower flat plate 220.

The packaged structure 300' sandwiched between the upper protection layer 215' and the lower protection layer 225 is placed on lower flat plate 220, the upper flat plate 210 is lowered and a pressure P' is applied on the upper flat plate 210. The applied pressure P' flattens the warped packaged structure 300'. Due the selected contact areas of the upper protection layer 215', pressure P' is applied on the protruding portions of packaged structure 300' to push down the protruding portions.

The remaining processing sequence of the flattening process is similar to those described above in FIGS. 2B, 2D and 2E. Similarly, the flattening process also involves a thermal process similar to the one described in FIG. 2C. In some embodiments, the pressure P' applied is in a range from about 1 atm to about 50 atm. In some embodiments, the processing temperature $T_P'$ for the flattening process for packaged structure 300' is in a range from about 140° C. to about 200° C. In some embodiments, the processing time $t_1'$ of the first period (thermal period) for the flattening process of packaged structure 300' is in a range from about 15 minutes to about 2 hours. In some embodiments, $t_1'$ is in a range from about 30 minute to about 1 hour. In some embodiments, the processing time $t_2'$ of the second period (cooling period) is in a range from about 15 minutes to about 2 hours. In some embodiments, $t_2'$ is in a range from about 30 minute to about 1 hour.

Figure 5A:
FIG. 5A is a cross-sectional view of a packaged structure with multiple semiconductor packages, in accordance with some embodiments.
Figure 5B:
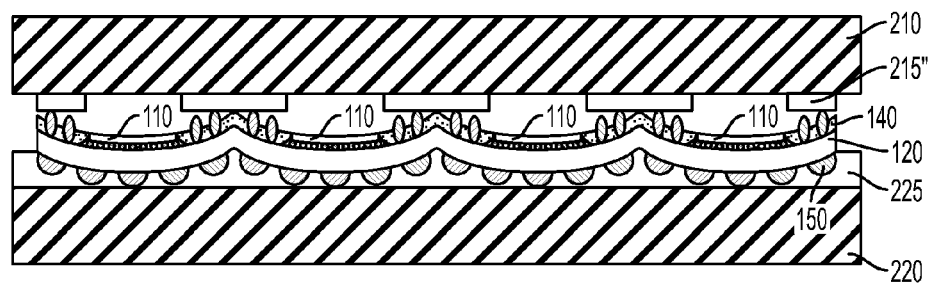
FIG. 5B is a packaged structure being placed in a flattening apparatus, in accordance with some embodiments.

As mentioned above in the description of FIGS. 3A and 3B, semiconductor package 300 or 300* may warp upward at the edges in some embodiments. FIG. 5A is a cross-sectional view of a packaged structure 300" with multiple semiconductor packages 300 before being sawed, in accordance with some embodiments. Due to the different warpage profile, the upper protection layer 215" used to flatten the packaged structure 300' is placed on the protruding portions of structures 300', as shown in FIG. 5B in accordance with some embodiments. The upper protection layer 215" covers the protruding molding compound 140 in accordance with some embodiments. In some other embodiments, the upper protection layer 215" covers the protruding molding compound 140 and also a portion of semiconductor dies 110.

Processing results show that the planarity of packaged structures, such as structures 100', 300', or 300", is greatly improved after undergoing one or more of the flattening processes described above. The planarity of packaged structures also ensures the planarity of sawed packaged dies. Planarity can be inspected and measured by automated visual inspection tool. In some embodiments, the planarity of packaged die after flattening is equal to or greater than about 90%. In some other embodiments, the planarity is equal to or greater than about 95%. In yet some other embodiments, the planarity is equal to or greater than about 99%.

Embodiments of mechanisms for flattening a packaged structure are provided. The mechanisms involve a flattening apparatus and the utilization of protection layer(s) between the packaged structure and the surface(s) of the flattening apparatus. The protection layer(s) is made of a soft and non-sticking material to allow protecting exposed fragile elements of the packaged structure and easy separation after processing. The flattening process in some embodiments involves flattening the warped packaged structure by pressure under elevated processing temperature. Processing under elevated temperature allows the package structure to be flattened within a reasonable processing time.

In some embodiments, a method of flattening a packaged structure having warpage is provided. The packaged structure is placed between an upper flat plate and a lower flat plate of a flattening apparatus. The packaged structure is protected by at least one of an upper protection layer between the packaged structure and the upper flat plate of the flattening apparatus, or a lower protection layer between the packaged structure and the lower flat plate of the flattening apparatus. The method further includes applying a pressure on the packaged structure by the flattening apparatus to flatten the packaged structure, and applying a thermal profile on the flattening apparatus.

In some other embodiments, a method of flattening a packaged structure having warpage is provided. The packaged structure is placed between an upper flat plate and a lower flat plate of a flattening apparatus. The packaged structure is protected by an upper protection layer against the upper flat plate of the flattening apparatus. The upper protection layer is not continuous and is placed on protruding portions of the packaged structure. The method further includes applying a pressure on the packaged structure by the flattening apparatus to flatten the packaged structure, and applying a thermal profile on the flattening apparatus.

In yet some other embodiments, an apparatus for flattening a packaged structure is provided. The apparatus includes an upper flat plate, a lower flat plate, and an upper protection layer next to the upper flat plate. The apparatus also includes a lower protection layer next to the lower flat plate. The apparatus is configured to flatten the packaged structure placed between the upper protection layer and the lower protection layer. The packaged structure has exposed conductive connectors to be protected by at least one of the upper protection layer or the lower protection layer against the corresponding upper or lower flat plate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of flattening a packaged structure, comprising:
placing the packaged structure having warpage between an upper flat plate and a lower flat plate of a flattening apparatus, wherein the packaged structure is protected by at least one of
an upper protection layer between the packaged structure and the upper flat plate of the flattening apparatus, or
a lower protection layer between the packaged structure and the lower flat plate of the flattening apparatus;
applying a pressure on the packaged structure by the flattening apparatus to flatten the packaged structure;
applying a thermal profile on the flattening apparatus; and
singulating the packaged structure into individual packaged dies after being flattened in the flattening apparatus, wherein the planarity of a sawed packaged die is equal to or greater than about 95%.

2. The method of claim 1, wherein the packaged structure includes a numbered a packaged dies, wherein each of the packaged dies has a number of exposed conductive connectors.

3. The method of claim 1, wherein the upper protection layer and the lower protection layer protect exposed elements on the packaged structures from being deformed by the flattening apparatus.

4. The method of claim 1, wherein at least one of the upper protection layer or the lower protection layer is made of a soft and not-sticking material.

5. The method of claim 1, wherein at least one of the upper protection layer or the lower protection layer is made of a material selected from the group consisting of Polytetrafluoroethylene (PTFE), Ethylene tetrafluoroethylene (ETFE) and Teflon.

6. The method of claim 1, wherein the upper protection layer or the lower protection layer has a thickness in a range from about 0.05 mm to about 0.5 mm.

7. The method of claim 1, wherein the pressure is in a range from about 1 atm to about 50 atm.

8. The method of claim 1, wherein the thermal profile include a first period of heating and a second period of cooling.

9. The method of claim 8, wherein the apparatus is heating to a temperature in a range from about 140° C. to 200° C. in the first period.

10. The method of claim 8, wherein the duration of the first period is in a range from about 15 minute to about 2 hours.

11. The method of claim 8, wherein the apparatus is cooled to room temperature in the second period.

12. The method of claim 11, wherein the apparatus is cooled by passing ambient air or a cooling gas over a surface of the apparatus.

13. The method of claim 8, wherein the duration of the second period is in a range from about 15 minute to about 2 hours.

14. The method of claim 8, wherein the packaged structure includes a molding compound, wherein the molding compound is made of a thermoset plastic, wherein the molding compound becomes fluidic under the processing temperature of the first period.

15. The method of claim 1, wherein the packaged structure has a wavy warpage profile before being flattened in the flattening apparatus.

16. A method of flattening a packaged structure, comprising:
placing the packaged structure having warpage between an upper flat plate and a lower flat plate of a flattening apparatus, wherein the packaged structure is protected by an upper protection layer against the upper flat plate of the flattening apparatus, and wherein the upper protection layer is not continuous and is placed on protruding portions of the packaged structure;
applying a pressure on the packaged structure by the flattening apparatus to flatten the packaged structure; and
applying a thermal profile on the flattening apparatus.

17. An apparatus for flattening a packaged structure, comprising:
an upper flat plate;
a lower flat plate;
an upper protection layer next to the upper flat plate; and
a lower protection layer next to the lower flat plate, wherein the apparatus is configured to flatten the packaged structure placed between the upper protection layer and the lower protection layer, and wherein the packaged structure has exposed conductive connectors adapted to be protected by at least one of the upper protection layer or the lower protection layer against the corresponding upper or lower flat plate.

18. The apparatus of claim 17, wherein the upper protection layer and the lower protection layer are made of a soft and non-sticking material.

19. The apparatus of claim 17, wherein the upper protection layer or the lower protection layer has a thickness in a range from about 0.05 mm to about 0.50 mm.

20. The apparatus of claim 17, wherein the apparatus is configured to increase a processing temperature of the packaged structure being flattened in the apparatus during a first period, and to decrease the processing temperature during a second period subsequent to the first period.

* * * * *